US006446316B1

(12) United States Patent
Fürbacher et al.

(10) Patent No.: US 6,446,316 B1
(45) Date of Patent: *Sep. 10, 2002

(54) METHOD FOR PRODUCING AN ENCAPSULATION FOR A SAW COMPONENT OPERATING WITH SURFACE ACOUSTIC WAVES

(75) Inventors: Bruno Fürbacher, Ingolstadt; Friedrich Lupp, München; Wolfgang Pahl, München; Günter Trausch, München, all of (DE)

(73) Assignee: Siemens Matsushita Components GmbH & Co. KG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/099,019

(22) Filed: Jun. 17, 1998

Related U.S. Application Data

(62) Division of application No. 08/743,540, filed on Nov. 4, 1996, now Pat. No. 5,831,369, which is a continuation of application No. PCT/EP95/01658, filed on May 2, 1995.

(30) Foreign Application Priority Data

| May 2, 1994 | (DE) | ........................................... | 44 15 411 |
| Sep. 13, 1994 | (DE) | ........................................... | 44 32 566 |

(51) Int. Cl.$^7$ ............................................... H04R 17/00
(52) U.S. Cl. ..................... 29/25.35; 310/313 R; 29/841
(58) Field of Search ............................... 29/25.35, 841; 310/313 R

(56) References Cited

U.S. PATENT DOCUMENTS 2,824,219 A * 2/1958 Fisher
3,622,816 A   11/1971 McGrew
4,034,318 A   7/1977 Ishiyama et al.
4,047,129 A   9/1977 Ishiyama (List continued on next page.)

FOREIGN PATENT DOCUMENTS

| DE | 252 473 A1 | 8/1986 |
| DE | 39 37 996 A1 | 5/1990 |
| EP | 0 367 181 A2 | 5/1990 |
| FR | 2 516 702 | 11/1981 |
| GB | 1 512 593 | 6/1978 |
| JP | 61-152112 | * 7/1986 |
| JP | 1-231415 | * 9/1989 |
| JP | 1-1229514 | * 9/1989 |
| JP | 2-305013 | * 12/1990 |
| JP | 403016311 | * 1/1991 |
| JP | 3-104409 | * 5/1991 |
| JP | 3-173214 | * 7/1991 |
| JP | 3-173216 | * 7/1991 |
| JP | 6-6169 | * 1/1994 |

OTHER PUBLICATIONS

Merriam Webster's Collegiate Dictionary, p. 451, 1997.*
"Mobilcom Demands Surface–Mountable Crystal Units", 2209 JEE Journal of Electronic Engineering, May 30, 1993, No. 317, Tokyo, pp. 66–68.
"Detecting Devices, Basic Elements of Chemical Microsensoring " (Krull et al.), TR Technische Rundschau, vol. 90, 1993, pp. 46–52.

*Primary Examiner*—David P. Bryant
*Assistant Examiner*—Steve Blount
(74) *Attorney, Agent, or Firm*—Laurence A. Greenberg; Werner H. Stemer; Ralph E. Locher

(57) ABSTRACT

An encapsulation for SAW components and a method for producing the encapsulation use a cap to seal component structures on a substrate. The cap is in the form of a cover on the substrate and has cutouts which accommodate the component structures in regions of the component structures.

2 Claims, 1 Drawing Sheet

U.S. PATENT DOCUMENTS

| | | | |
|---|---|---|---|
| 4,213,104 A | | 7/1980 | Cullen et al. |
| 4,230,901 A | * | 10/1980 | Wengler et al. ......... 174/52 PE |
| 4,270,105 A | | 5/1981 | Parker et al. |
| 4,291,285 A | | 9/1981 | Kadota |
| 4,362,961 A | * | 12/1982 | Gerber ...................... 310/370 |
| 4,445,256 A | * | 5/1984 | Huguenin et al. ......... 29/25.35 |
| 4,480,148 A | | 10/1984 | Archer |
| 4,628,146 A | * | 12/1986 | Schmodtz |
| 4,699,682 A | | 10/1987 | Takishima |
| 4,855,868 A | * | 8/1989 | Harding |
| 4,872,825 A | * | 10/1989 | Ross ......................... 425/117 |
| 5,010,270 A | | 4/1991 | Greer |
| 5,059,848 A | | 10/1991 | Mariani |
| 5,107,586 A | * | 4/1992 | Eichel Berger et al. |
| 5,214,844 A | * | 6/1993 | McWilliams |
| 5,237,235 A | | 8/1993 | Cho et al. |
| 5,410,789 A | * | 5/1995 | Noto et al. |
| 5,457,881 A | * | 10/1995 | Schmidt |
| 5,467,253 A | * | 11/1995 | Heckman et al. |
| 5,566,051 A | * | 10/1996 | Burns |
| 5,611,129 A | * | 3/1997 | Yoshimoto et al. ........ 29/25.35 |
| 5,623,236 A | | 4/1997 | Yoshinaga et al. |
| 5,831,369 A | * | 11/1998 | Furbacher ............... 310/313 R |
| 5,920,142 A | * | 7/1999 | Onishi et al. |

\* cited by examiner

METHOD FOR PRODUCING AN ENCAPSULATION FOR A SAW COMPONENT OPERATING WITH SURFACE ACOUSTIC WAVES

CROSS-REFERENCE TO RELATED APPLICATION

This application is a division of application Ser. No. 08/743,540, now U.S. Pat. No. 5,831,369, filed on Nov. 4, 1996, which was a continuation of International Application Serial No. PCT/EP95/01658, filed May 2, 1995.

BACKGROUND OF THE INVENTION

FIELD OF THE INVENTION

The present invention relates to an encapsulation for electronic components, in particular for components which operate by using surface acoustic waves (SAW components), having a cap which seals component structures on a substrate. The invention also relates to a method for producing the encapsulation.

Encapsulations and housings for electronic components, in particular for SAW components for radio-frequency applications as well, are preferably constructed to be hermetically sealed and include, for example, a metallic cap and a metallic base plate or else a partially metallized carrier for the component system. In the case of SAW components, the term component system in general means a piezo electric substrate having metallic structures mounted on it which form, for example, transducers, resonators or reflectors, as well as electrical connections for those metallic structures. As a rule, the metallic structures are aluminum structures which cannot be passivated. After installation in metal or metal/ceramic housings or encapsulations, short circuits may occur on the metallic structures. Such short circuits are caused by electrically conductive metallic particles. Those particles can become detached from the inside of the cap or from the metallized regions of the component system carrier. Furthermore, the soldering or welding of the cap and base plate or component system carrier may be a source of such Conductive metallic particles, since solder or welding spatter, which cannot be completely avoided, may lead to short circuits on the metallic component structures. Finally, it is also possible for metallic particles to be produced when making contact between wires and the electrical connections of the metallic component structures.

The problem of short circuits resulting from conductive metallic particles of the type mentioned above can be avoided, for example, either by avoiding the production of the particles, by removing existing particles, or by such particles being reliably fixed at safe points.

The particles are predominantly formed on caps and metallic base plates during the production of the caps, for example by friction during rolling or in a thermoforming and stamping tool. Attempts may be made through the use of intensive cleaning processes to keep the number of particles as low as possible or to coat the inside of the caps before assembly, for example with a polymer which binds and fixes the particles. However, polymer coatings are disadvantageous since their application onto defined regions, for example in the case of polygonal caps, is difficult in production terms, complete coating of the inner surface is not possible, because soldered or welded edges and regions of the heat influence zone during soldering or welding must remain free, and space problems caused by relatively thick layers and outgassing from the polymer adversely affect the long-term functionality of the components.

Furthermore, metallic coatings that are composed, for example, of nickel, may be applied electrochemically or non-electrochemically (chemically) in order to fix particles in caps or on metallic base plates. However, it is not possible to achieve complete freedom from particles, even in that way.

In the case of ceramic component system carriers, it is not possible to completely avoid particles of the metallization breaking off or becoming detached, particularly on relatively sharp edges, even when, with that in mind, the component system carrier is constructed optimally, for example by rounding the edges or ending the metallization before the edges.

Furthermore, with the present-day standard, it is impossible to implement wire contacts completely without any friction.

Passivation of the component structures on the substrate through the use of insulating, sufficiently thick layers immediately on the structures is not possible as a rule in the case of high-precision components, since the component characteristics are undesirably influenced even by very thin layers. For example, in the case of SAW components in the form of bandpass filters, that can lead, for example, to a shift in the mid-frequency or to an increase in the bandwidth. Compensation for the change in component characteristics through the use of structures which are trimmed to take account of those aspects is not always possible since, with the present-day standard, it is very difficult to apply thin layers with sufficient layer thickness reproducibility.

SUMMARY OF THE INVENTION

It is accordingly an object of the invention to provide an encapsulation for electronic components and a method for producing the encapsulation, which overcome the hereinaforementioned disadvantages of the heretofore-known devices and methods of this general type and which reliably shield metallic component structures against conductive metallic particles in the case of electronic components, in particular in the case of SAW components, in such a way that electrical characteristics, and in the case of SAW components acoustic characteristics as well, are not unacceptably influenced. This is done since, as mentioned above, conductive metallic particles which cause short circuits cannot be completely avoided at an economically acceptable cost and direct passivation of component structures is possible only in exceptional cases.

With the foregoing and other objects in view there is provided, in accordance with the invention, in a component operating with surface acoustic waves (SAW component) and having a substrate and component structures on the substrate, an encapsulation for the component, comprising a cap sealing the component structures on the substrate, the cap being formed by a cover on the substrate and the cover having cutouts formed therein in regions of the component structures for accommodating the component structures.

In accordance with another feature of the invention, the cover includes an upright carrier surrounding the component structures on the substrate and a covering layer applied onto the carrier.

In accordance with a further feature of the invention, the cover is an integral element containing the cutouts.

In accordance with an added feature of the invention, the carrier is a closed frame.

In accordance with an additional feature of the invention, the cover includes supports in addition to the carrier, the supports being disposed on the substrate in regions other than the regions of the component structures.

In accordance with yet another feature of the invention, the cover is bonded, welded or laminated onto the substrate.

In accordance with yet a further feature of the invention, the cover is formed of a material to be structured with a photographic technique.

In accordance with yet an added feature of the invention, the carrier and the supports are formed of a material to be structured with UV light.

In accordance with yet an additional feature of the invention, the carrier and the supports are formed of a photoresist material.

In accordance with again another feature of the invention, the covering layer is formed of a glass material.

In accordance with again a further feature of the invention, the covering layer is formed of a glass ceramic.

In accordance with again an added feature of the invention, the covering layer is formed of a material to be structured by a photographic technique.

In accordance with again an additional feature of the invention, the cover exposes or uncovers electrical connections on the substrate.

In accordance with still another feature of the invention, the cover has openings formed therein for introduction of an acoustic damping compound.

In accordance with still a further feature of the invention, there is provided a plastic sheath disposed over the cover.

In accordance with still an added feature of the invention, the sheath is formed of a plastic film.

With the objects of the invention in view there is also provided a method for producing an encapsulation for a component operating with surface acoustic waves (SAW component) and having a substrate and component structures on the substrate, which comprises forming cutouts in a cover for accommodating the component structures with the cutouts; sealing the component structures on the substrate with the cover to form a cap; producing a plastic film sheath for the covered substrate by dipping, sintering, potting, extrusion coating or press coating using plastic compounds on a base of reactive resins or melted thermoplastics; and placing the sheath over the cover.

In accordance with a concomitant mode of the invention, there is provided a method which comprises producing the cover and the sheath from materials ensuring the cutout, after production of the encapsulation, on the basis of mechanical characteristics of the materials, preferably expansion and shrinkage behavior.

Other features which are considered as characteristic for the invention are set forth in the appended claims.

Although the invention is illustrated and described herein as embodied in an encapsulation for electronic components and a method for producing the encapsulation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
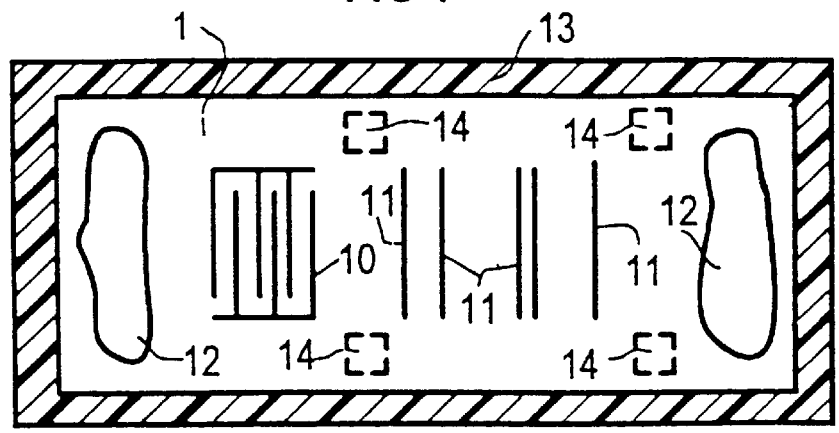
FIG. 1 is a diagrammatic, plan view of a part of an encapsulation according to the invention for an SAW component.

Referring now to the figures of the drawings in detail and first, particularly, to FIG. 1 thereof, there is seen a diagrammatic plan view of an electronic component that is an SAW component having a piezo electric substrate 1 on which metallic component structures 10 and 11 are provided. The component structures may, for example, be an interdigital converter 10 and reflectors 11. Such structures are known per se and will thus not be explained in more detail herein. Furthermore, acoustic damping compounds 12, so-called sinks, may be provided in specific regions on the piezo electric substrate 1, in a manner that is known per se. The configuration described above is referred to as a component system herein, for the purpose described initially.

Figure 2:
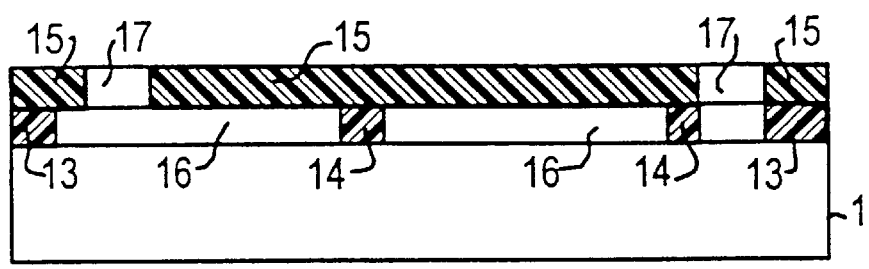
FIG. 2 is a sectional view of the component according to FIG. 1.

In order to avoid the damaging influences of electrically conductive metallic particles as described initially, an encapsulation is provided on the component substrate 1, according to the invention. According to the heart of the invention the encapsulation is formed by a cap in the form of a cover 13, 14, 15 (see also FIG. 2 in this context) which has cutouts 16 that accommodate the component structures 10 to 12 (see FIG. 2) in regions of the component structures 10 to 12. In the exemplary embodiment according to FIG. 1, the cover includes a carrier 13 which is constructed in such a way that it is located at an outer edge of the substrate 1. However, this is not absolutely essential according to the invention. For example, the carrier 13 can also be constructed in such a way that the sinks 12 are also located entirely or partially outside the carrier 13.

According to a development of the invention, the cover (13, 14, 15) includes the carrier 13, which surrounds the component structures 10 to 12, on the component substrate 1, and by a covering layer 15 which is mounted onto the carrier. The carrier 13 is preferably constructed as a closed frame, so that a closed, hermetically sealed encapsulation is produced in an advantageous manner. A distance between the covering layer 15 and the structures 10 and 11 should be of such a size that the correct operation of the component is not influenced at any time during use. However, the carrier 13 need not necessarily have the form of a closed frame, but may, if required, also contain apertures through which parts of the substrate surface are accessible.

According to another development of the invention, in addition to upright carrier 13 in the form of a frame, supports 14 may also be provided, which contribute to the mechanical support of the covering layer 15. According to one embodiment of the invention, the cover forming the cap 13, 14, 15 may be formed by a foil which contains depressions 16 on the side of the component substrate 1 that cross over the component structures 11, 12, 13. This can be implemented by stamping, thermoforming or partial material removal from the foil which is provided for the cover. The foil which is processed in this way can then be applied onto the component substrate 1, for example by bonding, welding or lamination.

According to a further embodiment of the invention, the cover 13, 14, 15 may be formed by a multilayer composite. To this end, a first foil may be initially formed over the entire surface of the component substrate and be provided with the cutouts 16 by mechanical processing, for example stamping or another type of perforating operation. The upright carrier 13, which is in the form of a frame, as well as the supports 14, if required, are then produced in this way. The covering layer 15 can then be applied in the form of a prestructured foil or film, or in the for thin glass, for example by bonding, or melting onto the carrier 13 and the supports 14.

However, according to another embodiment of the invention, a material which can be structured by using a photographic technique is used for the carrier 13, the covering layer 15 and, if required, the supports 14. For example, the material may be a photoresist or a. material which can be structured by using UV light. This material is then exposed in such a way that, after a developing step, only the component structures 10, 11, 12 and, in addition, surfaces which are also provided for making electrical contact with these.component structures (see FIG. 3), are bare or exposed.

The covering layer 15 is thus applied onto the carrier 13 which has been produced in this way, and if required onto the supports 14, and is likewise composed of a material of the type mentioned above which can be structured by using a photographic technique. This material may be applied in the form of a solid film which, given an adequate thickness of the first layer that forms the carrier 13 and, if required, the supports 14, forms the cutouts 16 with this layer.

Figure 3:
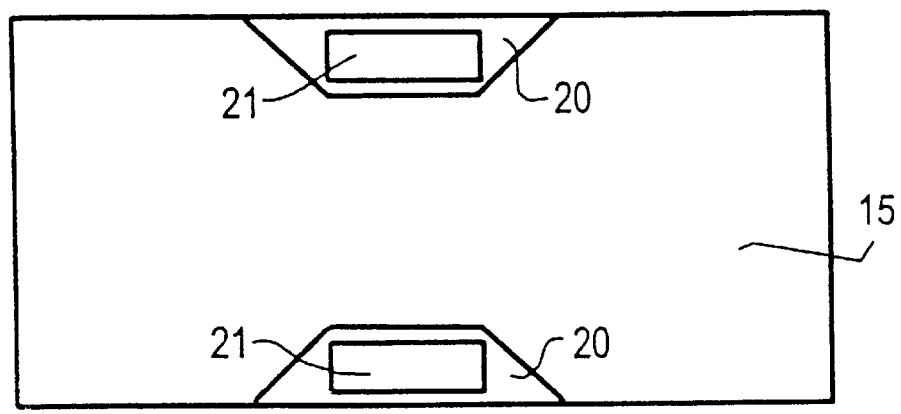
FIG. 3 is a plan view of a component according to FIGS. 1 and 2, having a covering layer which is specifically structured for making electrical contact.

Regions 20 may be exposed by photographic structuring of the covering layer 15 in order to make contact with the component structures 10 and 11, as is illustrated diagrammatically in the plan view according to FIG. 3. Contact pads 21 are thus exposed in these regions 20, for making contact by bonding.

After completion of the cover forming the cap which has been explained above, further processing of the component can take place in a manner that is known per se.

Furthermore, for certain applications it is advantageous for a plastic sheath, which is preferably composed of a plastic film, to be disposed over the cover.

A method for producing such an encapsulation includes the sheathing of the covered substrate being produced by dipping, sintering, potting, extrusion coating or press coating using plastic compounds on a base of reactive resins or melted thermoplastics, which are materials that are preferably used for covering and sheathing that ensure the required cutout, after production of the encapsulation, on the basis of their mechanical characteristics, preferably their expansion and shrinkage behavior.

A component according to the invention may be produced in the following manner.

After manufacture of a wafer, a substrate (chip) is covered with a suitable plastic film which has cutouts in the region of the component structures. This is followed by the chips being separated by sawing, breaking off or the like.

This is followed by the chips being mounted and by the production of the electrical connections in a known manner in such a way that the chips are mounted on carrier strips or housing parts and contact is made with them, for example through the use of bonding wires. Making contact through the use of bonding wires can also be omitted if contact areas are kept accessible on the chips (for example for later "chip on board" mounting) or if it is intended to use contact-free signal transmission (for example induction).

These method steps are followed by (complete or partial) sheathing of the chips using normal methods such as dipping, sintering, potting, extrusion coating or press coating using materials on a base of reactive resins or melted thermoplastics. Covering, preferably with a plastic film, in this case ensures that the surfaces of the chip with the component structures do not come into contact with the sheathing compound at all, and do not come into contact with the cover, at least not permanently.

If the sheathing compound is processed at sufficiently low pressures, then the cover is not deformed or is only slightly deformed. At the same time, the enclosed gas cushion between the chip and the cover has a supporting effect since the compression counteracts the cover being pressed downwards.

At higher processing pressures, it is no longer possible to prevent the cover from being pressed down as far as the chip surface. However, the use of suitable materials for the cover and the sheath as well as appropriate control of the process conditions ensures that a small defined distance (preferably in the $\mu$m range) is formed between the chip surface and the cover once the sheathing compound has cured. This is made possible in particular by suitable variation and combination of the mechanical characteristics of the materials being used (different longitudinal expansions and shrinkages that are caused, for example, by temperature differences and/or chemical reactions).

The individual method steps in the production of a SAW component are indicated in the following exemplary embodiment.

Metallization and structuring of the wafer,

Lamination of the wafer using a resist film which can be structured by UV,

Exposure and developing in order to expose the subsequent cavities and, if required, contact surfaces, etc., Lamination of the covering layer from the same resist film on the base layer produced in this way, Exposure and developing in such a manner that the cavity remains covered but, if required, other points (bonding pads, sawing lines, adjustment marks) are exposed, Press coating of the chips, which are bonded onto a lead frame (carrier), through the use of a conventional method.

During the last method step, the covering film is initially pressed down onto the chip surface over virtually the entire area by the pressure of the hot pressing compound (approximately 100 bar). The critical factor is now that, according to the invention, the pressing compound shrinks far less towards the chip surface than the covering film does away from it, during cooling from the process temperature. The desired cavity is thus formed in conjunction with good adhesion of the pressing compound on the covering film, with a height of a few $\mu$m above the chip surface.

Finally, it should also be mentioned that openings 17 may be provided in the covering layer 15, through which sinks 12 of the type mentioned above and illustrated in FIG. 1 may be directly introduced.

We claim:

1. A method for producing an encapsulation for a surface acoustic wave (SAW) component having a substrate and SAW component structures on the substrate, which comprises:

producing a cap by providing a plastic frame-shaped carrier directly on the component substrate with a first photoresist layer applied directly on the component substrate, the carrier accommodating and surrounding the SAW component structures such that at least one cutout is placed in a region of the SAW component structures for accommodating the SAW component structures within the at least one cutout and covering the carrier with a second photoresist layer to encapsulate the SAW component structures on the substrate with the cap; and directly encapsulating the cap covering the SAW component structures onto the substrate with a plastic sheath by a sheathing process that is selected from dipping, sintering, potting, extrusion coating and press coating, using plastic components on a base of reactive resin or melted thermoplastics.

2. The method according to claim 1, which comprises producing the cap and the sheath from materials having thermomechanical expansion and shrinkage characteristics that insure the presence of the at least one cutout between the component structures and the cap after encapsulation.

* * * * *